US009012885B2

(12) United States Patent
Peter et al.

(10) Patent No.: US 9,012,885 B2
(45) Date of Patent: Apr. 21, 2015

(54) LIGHT-EMITTING SEMICONDUCTOR CHIP

(75) Inventors: Matthias Peter, Regensburg (DE); Tobias Meyer, Ihrlerstein (DE); Alexander Walter, Laaber (DE); Tetsuya Taki, Yokohama (JP); Juergen Off, Regensburg (DE); Rainer Butendeich, Regensburg (DE); Joachim Hertkorn, Alteglofsheim (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 133 days.

(21) Appl. No.: 13/518,809

(22) PCT Filed: Dec. 27, 2010

(86) PCT No.: PCT/EP2010/070761
§ 371 (c)(1),
(2), (4) Date: Aug. 15, 2012

(87) PCT Pub. No.: WO2011/080249
PCT Pub. Date: Jul. 7, 2011

(65) Prior Publication Data
US 2012/0298964 A1    Nov. 29, 2012

(30) Foreign Application Priority Data

Dec. 30, 2009    (DE) .................. 10 2009 060 747

(51) Int. Cl.
| | |
|---|---|
| H01L 29/06 | (2006.01) |
| H01L 33/14 | (2010.01) |
| H01L 33/04 | (2010.01) |
| H01L 33/06 | (2010.01) |
| H01L 33/22 | (2010.01) |
| H01L 33/38 | (2010.01) |

(52) U.S. Cl.
CPC ............... *H01L 33/14* (2013.01); *H01L 33/04* (2013.01); *H01L 33/06* (2013.01); *H01L 33/22* (2013.01); *H01L 33/382* (2013.01); *H01L 2224/16225* (2013.01); *H01L 2924/0002* (2013.01)

(58) Field of Classification Search
CPC .............................. H01L 33/14; H01L 33/32
USPC ........................... 257/9, 12–15, 20, 21
See application file for complete search history.

(56) References Cited

U.S. PATENT DOCUMENTS

| 6,563,850 B1 | 5/2003 | Matsumoto et al. |
| 6,677,619 B1 | 1/2004 | Nagahama et al. |

(Continued)

FOREIGN PATENT DOCUMENTS

| CN | 1564333 A | 1/2005 |
| CN | 101789473 A | 7/2010 |

(Continued)

OTHER PUBLICATIONS

Schnitzer, I., et al., "30% external quantum efficiency from surface textured, thin-film light-emitting diodes," Applied Physics Letters, vol. 63, No. 16, Oct. 18, 1993, 3 pages.

*Primary Examiner* — Matthew E Warren
(74) *Attorney, Agent, or Firm* — Slater & Matsil, L.L.P.

(57) ABSTRACT

A semiconductor chip includes a semiconductor body with a semiconductor layer sequence. An active region intended for generating radiation is arranged between an n-conductive multilayer structure and a p-conductive semiconductor layer. A doping profile is formed in the n-conductive multilayer structure which includes at least one doping peak.

15 Claims, 3 Drawing Sheets

(56) References Cited

U.S. PATENT DOCUMENTS

| | | | |
|---|---|---|---|
| 7,148,519 B2* | 12/2006 | Wu et al. | 257/97 |
| 7,193,246 B1 | 3/2007 | Tanizawa et al. | |
| 7,402,838 B2* | 7/2008 | Tanizawa et al. | 257/94 |
| 7,459,326 B2* | 12/2008 | Yamanaka et al. | 438/47 |
| 7,576,351 B2* | 8/2009 | Kyono et al. | 257/11 |
| 7,615,804 B2 | 11/2009 | Nagahama et al. | |
| 8,173,991 B2 | 5/2012 | Stauss et al. | |
| 8,536,615 B1* | 9/2013 | Driscoll et al. | 257/101 |
| 8,643,034 B2 | 2/2014 | Engl et al. | |
| 2002/0190263 A1* | 12/2002 | Hata et al. | 257/103 |
| 2003/0013261 A1* | 1/2003 | Asano | 438/330 |
| 2004/0004223 A1 | 1/2004 | Nagahama et al. | |
| 2005/0056850 A1* | 3/2005 | Taki | 257/79 |
| 2005/0277218 A1* | 12/2005 | Nakajo et al. | 438/46 |
| 2006/0049417 A1* | 3/2006 | Li et al. | 257/96 |
| 2006/0081861 A1 | 4/2006 | Wu et al. | |
| 2006/0192207 A1* | 8/2006 | Wook Shim et al. | 257/79 |
| 2006/0246612 A1 | 11/2006 | Emerson et al. | |
| 2007/0023768 A1* | 2/2007 | Konno et al. | 257/86 |
| 2007/0045655 A1* | 3/2007 | Song et al. | 257/104 |
| 2007/0051962 A1* | 3/2007 | Lai | 257/94 |
| 2008/0054289 A1* | 3/2008 | Tsai et al. | 257/99 |
| 2008/0149918 A1 | 6/2008 | Yoo et al. | |
| 2009/0072220 A1* | 3/2009 | Lee | 257/13 |
| 2009/0085057 A1 | 4/2009 | Park et al. | |
| 2011/0006320 A1 | 1/2011 | Koo et al. | |
| 2011/0193057 A1 | 8/2011 | Sabathil et al. | |

FOREIGN PATENT DOCUMENTS

| | | |
|---|---|---|
| DE | 10 2007 057 674 A1 | 6/2009 |
| JP | 10335757 A | 12/1998 |
| JP | 11274644 A | 10/1999 |
| JP | 11330554 A | 11/1999 |
| JP | 2000244013 A | 9/2000 |
| TW | 200537703 | 11/2005 |
| TW | 200638563 | 1/2006 |
| WO | WO 2009/039830 A1 | 4/2009 |
| WO | WO 2009/045005 A2 | 4/2009 |
| WO | WO 2009/072787 A2 | 6/2009 |
| WO | 2009106063 A1 | 9/2009 |

* cited by examiner

LIGHT-EMITTING SEMICONDUCTOR CHIP

This patent application is a national phase filing under section 371 of PCT/EP2010/070761, filed Dec. 27, 2010, which claims the priority of German patent application 10 2009 060 747.1, filed Dec. 30, 2009, each of which is incorporated herein by reference in its entirety.

TECHNICAL FIELD

The present invention relates to a semiconductor chip intended for generating radiation.

BACKGROUND

LED semiconductor chips often have an active region intended for generating radiation, with a plurality of quantum wells.

SUMMARY OF THE INVENTION

It has become apparent that, when there are InGaN quantum wells in the active region, the radiant power emitted does not increase in a linear manner as the current density increases. One cause of this is that the charge carriers are often not injected efficiently into the quantum wells.

In one aspect, a semiconductor chip is designed so that charge carriers may be injected efficiently into the active region.

In one embodiment, a semiconductor chip comprises a semiconductor body with a semiconductor layer sequence, the semiconductor layer sequence comprising an n-conductive multilayer structure, a p-conductive semiconductor layer and an active region intended for generating radiation. The active region is arranged between the n-conductive multilayer structure and the p-conductive semiconductor layer. A doping profile comprising at least one doping peak is formed in the n-conductive multilayer structure.

The doping profile in particular constitutes the profile of the doping in a vertical direction, thus in a direction which extends in the direction of deposition of the semiconductor layer sequence of the semiconductor body. In other words, the doping profile extends perpendicular to a main plane of extension of the semiconductor layers of the semiconductor layer sequence of the semiconductor body.

For the purposes of the application, a doping peak is understood to mean a region of a semiconductor material which has a high doping concentration compared with at least one region adjacent thereto. The semiconductor material surrounding the doping peak, preferably on both sides, is preferably low doped, undoped or intrinsic.

A high doping concentration is understood in particular to mean a concentration of at least $2*10^{18}$ cm$^{-3}$.

A low doping concentration is understood in particular to mean a concentration of at least $1*10^{16}$ cm$^{-3}$ and at most $1*10^{18}$ cm$^{-3}$.

It has been found that a doping peak which, in particular in comparison with the rest of the extent of the n-conductive multilayer structure, is thin and highly doped, leads to improved charge carrier injection into the active region of the semiconductor chip. As a result of high doping, the n-conductive multilayer structure exhibits comparatively high transverse conductivity in the region of the doping peak, i.e., high conductivity in the lateral direction, such that charge carriers may be injected particularly homogeneously into the active region in the lateral direction. The at least one doping peak also results in laterally more homogeneous current flow in the reverse direction, i.e., the blocking direction of the active region. In this way, the semiconductor chips exhibit reduced sensitivity to electrostatic discharge (ESD).

In a preferred configuration, the n-conductive multilayer structure comprises at least one region highly doped by means of the doping peak and one region of low n-conductive doping. A doping concentration in the at least one doping peak is preferably at least five times, particularly preferably at least eight times, for example ten times as high as in the region of low n-conductive doping of the n-conductive multilayer structure.

The region of low n-conductive doping may here in particular adjoin the doping peak.

The doping concentration in the doping peak preferably amounts to at least $4*10^{18}$ cm$^{-3}$. High conductivity may be achieved as a result of a high doping concentration.

Furthermore, the doping concentration in the doping peak preferably amounts to at most $1*10^{20}$ cm$^{-3}$, particularly preferably at most $3*10^{19}$ cm$^{-3}$.

Furthermore, the doping concentration in the in particular adjacent region of low n-conductive doping preferably amounts to at most $5*10^{17}$ cm$^{-3}$, particularly preferably at most $2*10^{17}$ cm$^{-3}$.

In one preferred configuration a doping concentration in the at least one doping peak amounts to at least $4*10^{18}$ cm$^{-3}$ and in the region of low n-conductive doping to at most $8*10^{17}$ cm$^{-3}$.

The vertical extent of the doping peak amounts preferably to between 1 nm and 30 nm inclusive, particularly preferably between 2 nm and 20 nm inclusive. In particular, the vertical extent of the doping peak may amount to between 7 nm and 10 nm inclusive.

The n-conductive multilayer structure serves in particular in the injection of electrons into the active region when the semiconductor chip is in operation. To this end, the n-conductive multilayer structure does not necessarily have to be n-conductively doped throughout. Rather, the n-conductive multilayer structure may also comprise one or more layers in which the n-conductive multilayer structure is undoped or intrinsic.

Accordingly, the p-conductive semiconductor layer is intended in particular for the injection of holes into the active region. The p-conductive semiconductor layer may also be of multilayer construction, wherein individual layers may differ with regard to doping and/or crystal composition.

The semiconductor body is preferably based on a compound semiconductor, in particular on a nitride compound semiconductor.

"Based on nitride compound semiconductors" means in the present context that the active epitaxial layer sequence or at least one layer thereof comprises a III/V nitride compound semiconductor material, preferably $Al_yGa_{1-x-y}In_xN$, wherein $0 \leq x \leq 1$, $0 \leq y \leq 1$ and $x+y \leq 1$. This material does not absolutely have to exhibit a mathematically exact composition according to the above formula. Instead, it may comprise one or more dopants and additional constituents which do not substantially modify the characteristic physical properties of the $Al_yGa_{1-x-y}In_xN$ material. For simplicity's sake, however, the above formula includes only the fundamental constituents of the crystal lattice (Al, Ga, In, N), even if these may in part be replaced by small quantities of further substances.

The active region preferably comprises a plurality of quantum layers. The quantum layers are conveniently arranged between barrier layers. The quantum layers and barrier layers may here form a quantum structure.

For the purposes of the application, the term "quantum structure" includes in particular any structure in which charge carriers may undergo quantisation of their energy states by inclusion ("confinement"). In particular, the term quantum structure does not provide any indication of the dimensionality of the quantisation. It thus encompasses inter alia quantum wells, quantum wires and quantum dots and any combination of these structures.

In a preferred configuration, the n-conductive multilayer structure comprises a quantum structure. This quantum structure may comprise a plurality of quantum layers.

The term quantum structure is furthermore understood to mean in particular both a configuration as a multi quantum well structure (MQW) and a configuration as a superlattice. Unlike in a multi quantum well structure, in a superlattice the distances between adjacent quantum layers are so small that electron states of adjacent quantum layers couple together quantum mechanically and form common electron states.

Barrier layers may for example be provided between the quantum layers of a superlattice, which barrier layers have a thickness of 5 nm or less, for example 2 nm.

In a preferred configuration, a band gap of the quantum layer of the n-conductive multilayer structure is at least as large as a band gap of the quantum layer of the active region. Particularly preferably, the band gap of the quantum layer is larger than the band gap of the quantum layer of the active region. For example, in the case of a semiconductor chip based on a nitride compound semiconductor material, the quantum layers of the n-conductive multilayer structure may have a lower indium content x than the quantum layers of the active region.

Unlike the quantum layers of the active region, the quantum layers of the n-conductive multilayer structure are not intended for generating radiation, but rather serve in particular for efficient injection of electrons into the active region, in which they may recombine with holes with the emission of radiation.

The quantum layers of the active region are preferably intrinsic or undoped.

In a further preferred configuration, the doping peak is arranged between the quantum layer of the n-conductive multilayer structure closest to the active region and the quantum layer of the active region closest to the n-conductive multilayer structure. Good lateral current distribution in the vicinity of the active region is thus ensured.

Furthermore, the distance of the doping peak from the active region, in particular from the quantum layer of the active region closest to the n-conductive multilayer structure, amounts to a distance of between 1 nm and 30 nm inclusive, particularly preferably between 2 nm and 20 nm inclusive, in particular between 7 nm and 10 nm inclusive.

By means of this highly doped doping peak in the vicinity of the active region, injection of charge carriers into the active region may take place particularly efficiently and in particular particularly homogeneously in the lateral direction. The at least one doping peak also brings about improved utilisation of a large number of possible charge carrier paths due to the high transverse conductivity, which reduces the risk of ESD damage compared to a semiconductor chip with no doping peaks in the n-conductive region of the semiconductor body.

The at least one doping peak is preferably configured such that the doping profile comprises sharp transitions from a low doping concentration to a high doping concentration and vice versa. On production of the semiconductor chip, this may be achieved by a low growth rate, for instance a rate of between 20 nm/h and 500 nm/h. Deposition preferably proceeds epitaxially, for instance by means of MOCVD.

In a preferred further development a crystal structure of the n-conductive multilayer structure comprises V-shaped indentations. Such indentations, which may form during deposition of the semiconductor layers in particular along dislocation lines, are also known as "V pits." Such V-shaped indentations may form in particular at a comparatively low deposition temperature of the semiconductor material, for instance below 950° C. These V-shaped indentations may lead to improved behaviour of the semiconductor chip in the non-conducting direction.

In a further preferred configuration, the doping profile may comprise at least one further doping peak. In particular, at least one quantum layer of the n-conductive multilayer structure may be arranged between the doping peak and the further doping peak. In other words, the doping profile may be configured such that one part of the quantum layers of the n-conductive multilayer structure is highly n-doped, while the remaining part of the quantum layers is low n-doped compared thereto.

The doping profile may also comprise more than two doping peaks, in particular between one and five doping peaks inclusive, preferably between one and three doping peaks inclusive.

In a preferred configuration of the semiconductor chip, a growth substrate for the semiconductor layer sequence of the semiconductor body is removed completely or at least partially. Such a semiconductor chip is also known as a thin film semiconductor chip.

A thin-film semiconductor chip, for instance a thin-film light-emitting diode chip, may furthermore be distinguished for the purposes of the present invention by at least one of the following characteristic features: on a first major surface, facing a carrier element, of a semiconductor body comprising a semiconductor layer sequence with an active region, in particular of an epitaxial layer sequence, a mirror layer is applied or formed, for instance integrated as a Bragg mirror in the semiconductor layer, said mirror layer reflecting back into the semiconductor layer sequence at least some of the radiation generated in said sequence; the semiconductor layer sequence has a thickness in the range of 20 µm or less, in particular in the range of 10 µm; and/or the semiconductor layer sequence contains at least one semiconductor layer with at least one face which comprises an intermixing structure, which ideally leads to an approximately ergodic distribution of the light in the semiconductor layer sequence, i.e., it exhibits scattering behaviour which is as ergodically stochastic as possible.

The basic principle of a thin-film light-emitting diode chip is described for example in I. Schnitzer et al., Appl. Phys. Lett. 63 (16), 18 October 1993, 2174-2176, whose disclosure content is hereby included by reference in this respect in the present application.

BRIEF DESCRIPTION OF THE DRAWINGS

Further features, configurations and convenient aspects are revealed by the following description of the exemplary embodiments in conjunction with the figures, in which.

Identical, similar or identically acting elements are provided with identical reference numerals in the figures.

The figures are in each case schematic representations and are therefore not necessarily true to scale. Rather, comparatively small elements and in particular layer thicknesses may be illustrated on an exaggeratedly large scale for clarification.

DETAILED DESCRIPTION OF ILLUSTRATIVE EMBODIMENTS

Figure 1A:
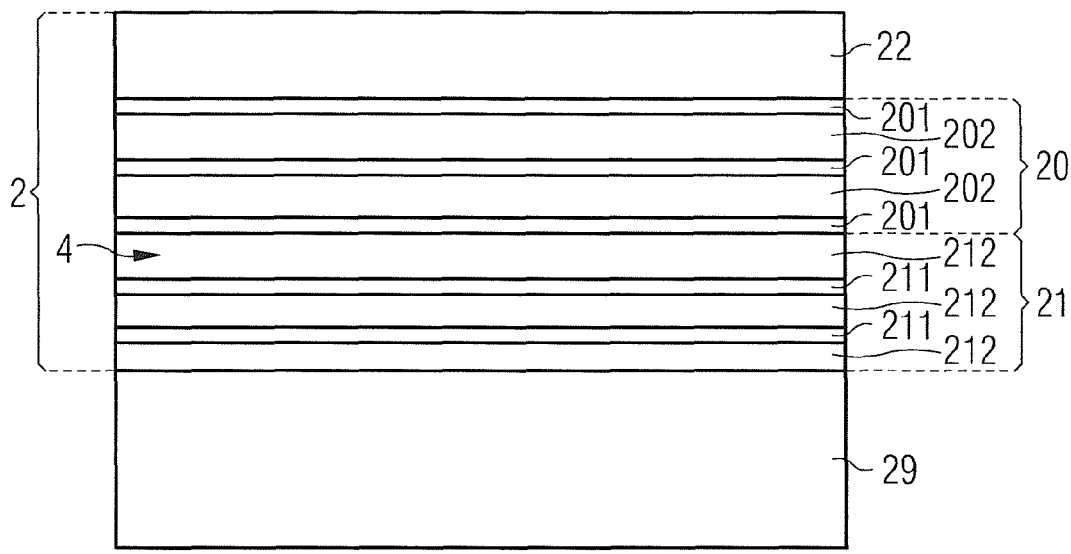
FIG. 1A is a schematic sectional view of an exemplary embodiment of a semiconductor body with a semiconductor layer sequence.

A first exemplary embodiment of a semiconductor body for a semiconductor chip is illustrated schematically in sectional view in FIG. 1A. The semiconductor body 2 comprises a semiconductor layer sequence which forms the semiconductor body. The semiconductor layer sequence comprises an active region 20 intended for generating radiation, which is arranged between an n-conductive multilayer structure 21 and a p-conductive semiconductor layer 22. The semiconductor layer sequence of the semiconductor body is preferably deposited epitaxially, in particular by MBE or MOCVD, on a growth substrate 29. Examples of materials suitable as a growth substrate for a semiconductor body based on a nitride compound semiconductor material are sapphire, silicon carbide, silicon or gallium nitride. A buffer layer may be formed between the n-conductive multilayer structure 21 and the growth substrate, which buffer layer may in particular be provided to enhance crystal quality (not shown explicitly).

The active region 20 comprises a quantum structure which is formed by a plurality of quantum layers 201 and a plurality of barrier layers 202 arranged between the quantum layers. The active region here comprises, merely by way of example, a quantum structure with three quantum layers. In contrast thereto, however, another number of quantum layers, for example just one or two quantum layers or more than three, for instance up to 20 quantum layers, for example five to eight quantum layers, may also be provided.

The p-conductive semiconductor layer 22 may also be of multilayer configuration, wherein the individual layers may differ from one another in particular by the material composition and/or by the doping thereof.

The n-conductive multilayer structure 21 comprises a quantum structure with a plurality of quantum layers 211, which are arranged between barrier layers 212.

A position of a doping peak 4 in the vertical direction, i.e., in a direction perpendicular to a main plane of extension of the semiconductor layers of the semiconductor body 2, is shown schematically by means of an arrow. The doping peak is located in the n-conductive multilayer structure 21, in particular between the quantum layer 211 of the n-conductive multilayer structure closest to the active region and the quantum layer 201 of the active region 20 closest to the n-conductive multilayer structure. In a region of the n-conductive multilayer structure adjoining the doping peak 4, the quantum layers 211 and the barrier layers adjoining the quantum layers are low doped.

Efficient injection of electrons into the active region 20 may proceed by means of the doping peak 4. In the reverse direction, the doping peak likewise brings about improved current spreading, which leads to a reduced risk of ESD damage to the semiconductor chip formed by means of the semiconductor layer sequence. Reduced ESD sensitivity is thus achieved as early as with deposition of the semiconductor layer sequence, so reducing the risk of damage to the semiconductor chip in a subsequent production step.

Figure 1B:
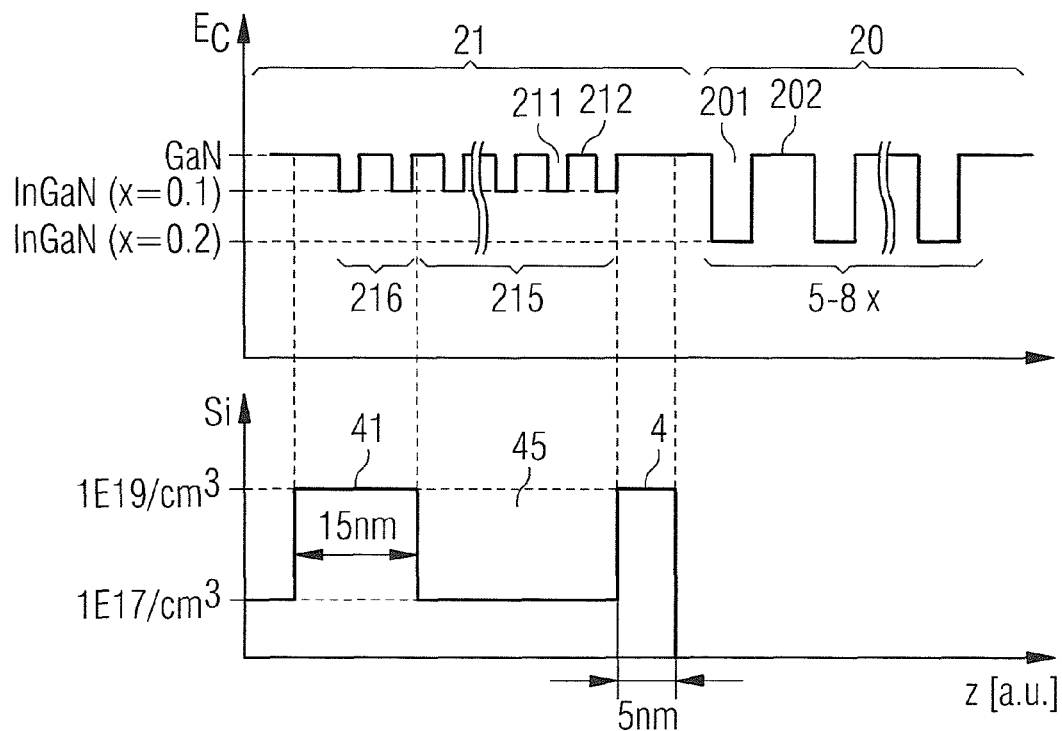
FIG. 1B shows schematic representations of a conduction band edge profile $E_C$ and a doping profile in each case in a deposition direction z for a portion of a semiconductor body according to a second exemplary embodiment.

A schematic profile of a conduction band edge profile $E_C$ and of a silicon doping profile is shown in FIG. 1B as a function in the z direction for a second exemplary embodiment of a semiconductor body for a semiconductor chip. The z direction corresponds to the direction of deposition of the semiconductor layers of the semiconductor body 2 and extends perpendicular to a main plane of extension of the semiconductor layers of the semiconductor body 2.

This second exemplary embodiment corresponds substantially to the first exemplary embodiment, described in conjunction with FIG. 1A, of a semiconductor body. In contrast thereto, a further doping peak 41 is provided in this exemplary embodiment.

The further doping peak 41 forms a highly doped sub-region of the quantum structure of the n-conductive multilayer structure 21. Between the further doping peaks and the doping peak 4 there is provided a region of low n-conductive doping 45 of the quantum structure.

The semiconductor body 2, in particular the active region 20, is based in this exemplary embodiment on a nitride compound semiconductor material.

The active region 20 comprises a plurality of quantum layers 201. In this exemplary embodiment the active region is intended for generating radiation in the blue spectral range. To this end, the quantum layers each comprise an indium content of x=0.2. The active region may however also be configured to emit radiation in a different spectral range. The higher the indium content, the lower the band gap and thus the energy of the photons generatable in the active region. The indium content may thus be varied within broad limits. For example, quantum layers with an indium content of x=0.10 emit radiation when in operation in the ultraviolet spectral range and quantum layers with an indium content of x=0.40 emit radiation in the green spectral range. Between the quantum layers GaN barrier layers 202 are arranged.

The doping profile for the n-conductive multilayer structure 21 is produced in this exemplary embodiment by means of silicon doping. A different dopant may also be used, however.

The doping profile comprises a doping peak 4. This doping peak amounts in this exemplary embodiment to a width of approximately 5 nm. In the region of the doping peak 4 the doping concentration amounts to $1*10^{19}$ cm$^{-3}$, while the doping concentration in a region of low n-conductive doping 45 adjoining the doping peak 4 comprises a doping concentration of $1*10^{17}$ cm$^{-3}$. Furthermore, the doping profile comprises a further doping peak 41 with a width of 15 nm, in which the n-conductive multilayer structure is n-conductively doped with a doping concentration of $1*10^{19}$ cm$^{-3}$.

By means of the doping peaks, charge carrier injection which is particularly uniform in the lateral direction may be achieved. Efficient current spreading therefore takes place, in particular immediately below the quantum layers 201 of the active region.

The n-conductive multilayer structure 21 comprises, as described in connection with FIG. 1A, a quantum structure with a plurality of quantum layers 211, which are arranged in each case between barrier layers 212. The doping profile results in a low doped sub-region 215 of the quantum structure and a highly doped sub-region 216 of the quantum structure. In these regions, the quantum layers and/or the barrier layers may each be doped. Preferably, the quantum layers and the barrier layers are highly doped, at least in the region of the at least one doping peak.

The n-conductive multilayer structure 21 thus comprises both a low doped sub-region of the quantum structure and a highly doped sub-region of the quantum structure. The low doped sub-region 215 of the quantum layers here extends between the doping peaks 4, 41 and forms an electron reservoir when the semiconductor chip is in operation. In the low doped sub-region of the quantum structure, the quantum layers 211 and the barrier layers 212 are low doped. The doping peak 4 brings about particularly efficient and laterally homogeneous injection of charge carriers from the n-conductive multilayer structure 21 into the quantum layers of the active region 20.

In this exemplary embodiment the quantum layers of the n-conductive multilayer structure 21 comprise an indium content of x=0.1, by way of example. The indium content may however also be selected to be different therefrom. The indium-content is preferably at most as high as the indium content of the quantum layers in the active region, such that the band gap of the quantum layers of the n-conductive multilayer structure 21 is larger than the band gap of the quantum layers in the active region 20 or corresponds to the band gap of the quantum layers in the active region.

The quantum structure of the n-conductive multilayer structure may in particular take the form of a quantum well structure or a superlattice, for example with barrier layers of a thickness of less than 5 nm, for instance of approximately 2 nm.

Efficient injection of charge carriers into the active region is simplified thereby.

It goes without saying that the material compositions of the active region 20 and the n-conductive multilayer structure 21 and the doping profile may also deviate from the exemplary embodiment illustrated.

Preferably, a doping concentration in at least one doping peak 4 amounts to at least $4*10^{18}$ cm$^{-3}$. Furthermore, the doping concentration in the doping peak preferably amounts to at most $1*10^{20}$ cm$^{-3}$, particularly preferably at most $3*10^{19}$ cm$^{-3}$.

In the region of low n-conductive doping 45 the doping concentration preferably amounts to at most $5*10^{17}$ cm$^{-3}$, particularly preferably at most $2*10^{17}$ cm$^{-3}$.

The doping concentration in the at least one doping peak is preferably at least five times, particularly preferably at least eight times as high as in the region of low n-conductive doping of the n-conductive multilayer structure.

The thickness, i.e., vertical extent, of the doping peak 4 and/or the further doping peak 41 preferably amounts to between 1 nm and 30 nm inclusive, particularly preferably between 2 nm and 20 nm inclusive, most preferably between 7 nm and 10 nm inclusive.

The doping peak 4 is preferably at a small distance from the active region 20, particularly preferably at a distance of at most 30 nm, in particular between 1 nm and 30 nm inclusive, preferably between 2 nm and 20 nm inclusive, most preferably between 7 nm and 10 nm inclusive.

Furthermore, unlike in the exemplary embodiments shown, more than two doping peaks may also be provided, for example between one and five doping peaks inclusive.

In addition, unlike in the exemplary embodiments shown the n-conductively doped multilayer structure 21 may also comprise layers or sublayers which are undoped or intrinsic. In this case, the undoped or intrinsic layers are conveniently thin enough for the n-conductive multilayer structure 21 to exhibit sufficiently high conductivity for electrons in the deposition direction.

To produce an as far as possible rectangular profile for the doping profile in the region of the doping peaks 4, 41 deposition preferably proceeds with a low growth rate, for example with a rate of between 20 nm/h and 500 nm/h inclusive.

Furthermore, the crystal structure of the n-conductive multilayer structure preferably comprises V-shaped indentations, which form in particular at low deposition temperatures, for instance below 950° C., in increased numbers along dislocations. These V-shaped indentations may lead to improved behaviour of the semiconductor chip on application of a voltage in the non-conducting direction.

Figure 2:
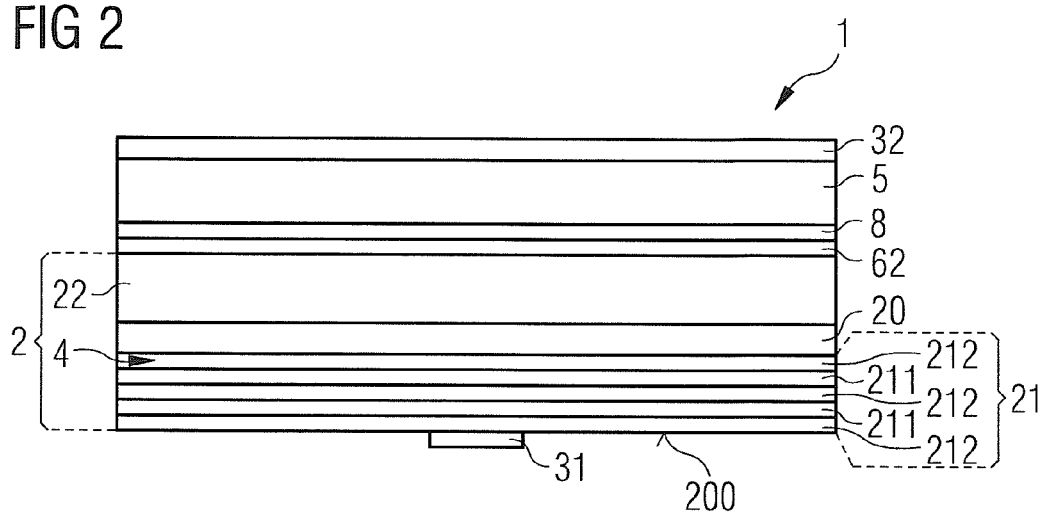
FIG. 2 is a schematic sectional view of a first exemplary embodiment of a semiconductor chip.

A first exemplary embodiment of a semiconductor chip 1 is shown in FIG. 2, the semiconductor body 2 being constructed by way of example as described in relation to FIG. 1A.

The semiconductor chip 1 here takes the form of a thin film LED semiconductor chip, in which the growth substrate 29 (FIG. 1A) for the semiconductor layer sequence of the semiconductor body 2 has been removed. The active region 20 is provided to generate incoherent radiation when in operation.

The semiconductor body 2 is arranged on a carrier 5. The carrier 5 serves in particular in mechanical stabilisation of the semiconductor body, such that the growth substrate is not needed for this purpose.

A semiconductor material, for example silicon, gallium arsenide or germanium, or a ceramic, for instance aluminium nitride, is suitable as carrier material.

The carrier 5 is connected mechanically stably and also electrically conductively to the semiconductor body by means of a bonding layer 8.

A suitable bonding layer is, for example, a solder or an electrically conductive adhesive.

A mirror layer 62 is formed between the carrier 5 and the semiconductor body 2. By means of the mirror layer, radiation generated in the active region 20 when the semiconductor body 2 is in operation, which is emitted in the direction of the carrier 5, may be reflected in the direction of the radiation exit face 200 and thus leave the semiconductor chip.

On the side of the semiconductor body 2 remote from the carrier 5, the semiconductor body comprises a first contact 31. On the opposing side of the semiconductor chip, i.e., on the side of the carrier 5 remote from the semiconductor body 2, a second contact 32 is formed.

The first contact and/or the second contact preferably contain a metal, for example gold, silver, platinum, aluminium, nickel, chromium or copper or an alloy with at least one of the stated materials.

By means of the first contact 31 and the second contact 32, charge carriers may be injected into the active region 20 from different sides when the semiconductor chip 1 is in operation and there recombine with emission of radiation.

The electrons injected via the first contact 31 are efficiently distributed in the lateral direction in the n-conductive multilayer structure 21 in the region of the at least one doping peak 4 and coupled in uniformly into the quantum layers 201 of the active region 20.

The minor layer 62 is preferably of metallic construction and moreover preferably exhibits high reflectivity for the radiation generated in the active region. Examples of suitable materials for the mirror layer are a metal, for instance aluminium, silver, gold, palladium or rhodium or a metal alloy with at least one of the stated metals.

Figure 3:
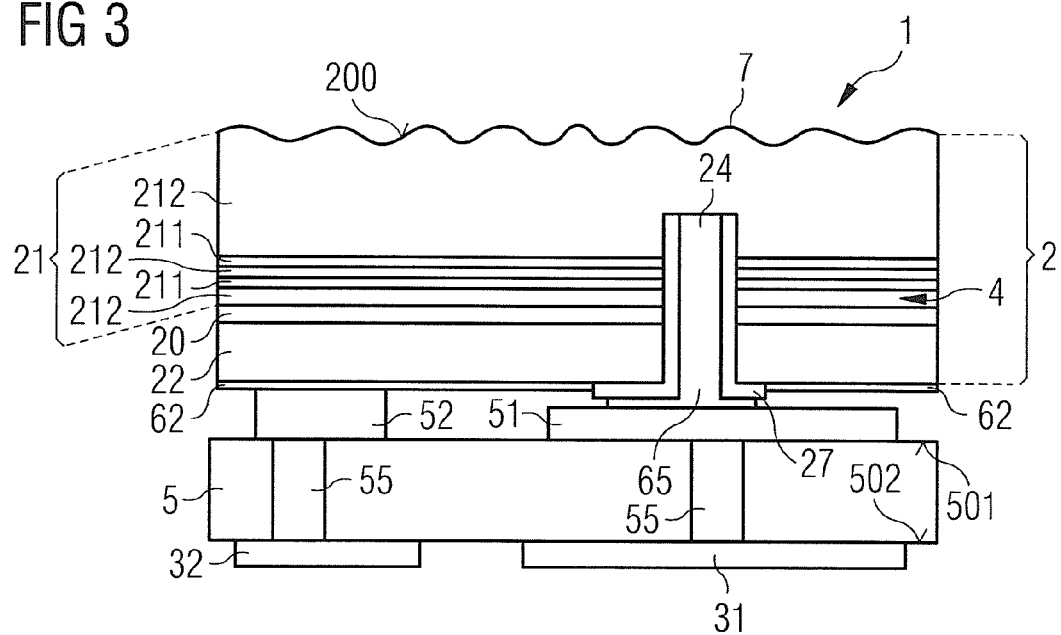
FIG. 3 is a schematic sectional view of a second exemplary embodiment of a semiconductor chip.

A second exemplary embodiment of a semiconductor chip 1 is illustrated schematically in sectional view in FIG. 3. The semiconductor body 2 is here again constructed as described in relation to FIG. 1A. Unlike the semiconductor chip according to the first exemplary embodiment described in relation to FIG. 2, the semiconductor body 2 comprises a recess 24, which extends from a side facing the carrier 5 through the p-conductive semiconductor layer 22 and through the active region 20 into the n-conductive multilayer structure 21. The recess here passes through the quantum layers 211 of the n-conductive multilayer structure. The side faces of the recess are covered by an insulation layer 27, which protects the semiconductor body 2 from an electrical short circuit of the active region 20.

A contact layer 65 is formed in the recess 24, which layer serves in electrical contacting of the active region from the side remote from the p-conductive semiconductor layer 22.

The carrier 5 comprises a first land 51 and a second land 52, wherein the first land 51 is connected electrically conductively via the contact layer 65 to the n-conductive multilayer structure 21 and the second land 52 is connected electrically conductively via the minor layer 62 to the p-conductive semiconductor layer 22. The first land 51 and the second land 52 are arranged on the same side of the carrier 5.

By means of the recess 24, the n-conductive multilayer structure 21 arranged on the side of the active region 20 remote from the carrier 5 is electrically contactable, such that the radiation exit face 200 may be free of an external electrical contact. Shading of the radiation exit face by a contact which is not radiation-transmissive is thereby prevented.

The carrier 5 comprises openings 55 which extend from a first major face 501 of the carrier facing the semiconductor body 2 through to a second major face 502 opposite the first major face. By means of these openings, the first land 51 is connected electrically conductively to the first contact 31 and the second land 52 is connected electrically conductively to the second contact 32, such that the semiconductor chip 1 is externally electrically contactable from the bottom of the semiconductor chip remote from the radiation exit face 200.

Furthermore, the semiconductor body 2 comprises patterning 7 on the side of the radiation exit face 200. The patterning serves to reduce total reflection of radiation generated in the active region within the semiconductor chip and thus to increase outcoupling efficiency. It goes without saying that such patterning may also be provided in the first exemplary embodiment of the semiconductor chip described in relation to FIG. 2.

Figure 4:
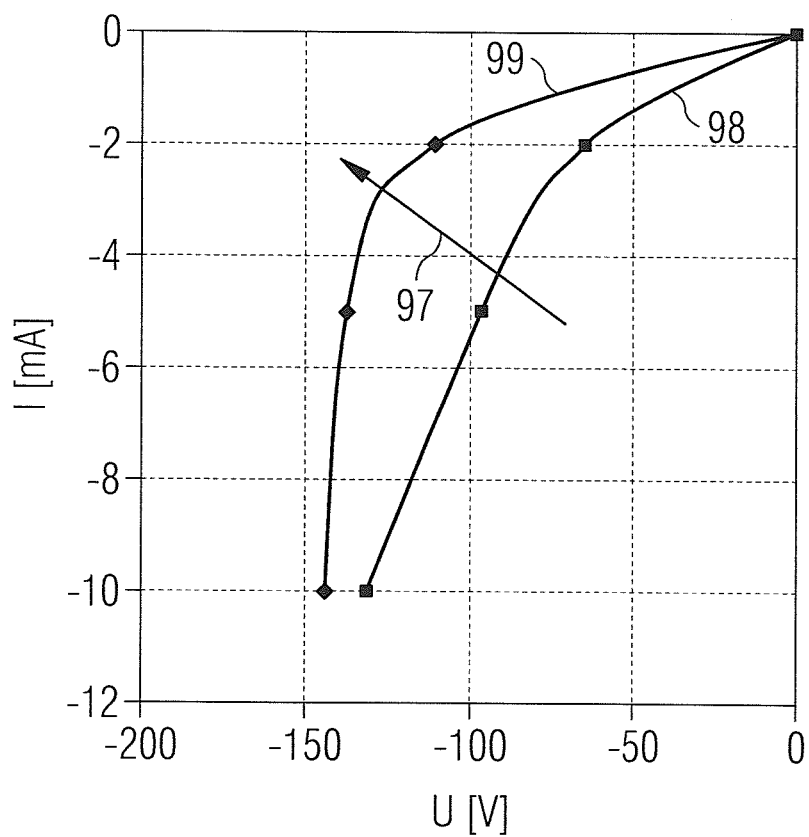
FIG. 4 shows the result of measurement of a current I as a function of a voltage U applied in the reverse direction.

FIG. 4 shows the behaviour of the reverse current I as a function of the voltage in the reverse direction, i.e., in the non-conducting direction of the active region 20. A curve 99 here shows measurements at a semiconductor layer sequence from which the semiconductor bodies for the semiconductor chips are obtained with subsequent processing. The semiconductor layer sequence is here constructed as described in relation to FIG. 1B.

In comparison, a curve 98 shows measurements at a semiconductor layer sequence in which a conventional n-conductive region without doping peaks is used.

An arrow 97 illustrates how the above-described structure of the n-conductive multilayer structure 21 makes it possible for the current profile to increase more slowly initially for small voltages and only to increase steeply with very high voltage values. The measurement curve thus shows a considerably more pronounced, bend-like profile.

The description of an LED semiconductor chip is used merely by way of example to describe the exemplary embodiments. The above-described configuration of the n-conductive multilayer structure 21 and of the doping profile with at least one doping peak 4 may however also be used for a component emitting coherent or at least partially coherent radiation, for example for a surface-emitting or an edge-emitting semiconductor laser chip or for an RCLED (resonance cavity light emitting diode).

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The invention claimed is:

1. A semiconductor chip comprising a semiconductor body with a semiconductor layer sequence, the semiconductor layer sequence comprising:
    an n-conductive multilayer structure, wherein a doping profile is formed in the n-conductive multilayer structure, the doping profile comprising at least one doping peak;
    a p-conductive semiconductor layer; and
    an active region provided for generating radiation, the active region arranged between the n-conductive multilayer structure and the p-conductive semiconductor layer
    wherein the n-conducting multilayer structure comprises a quantum structure with a plurality of quantum layers, the quantum layers being arranged between barrier layers;
    wherein a doping profile is formed in the n-conductive multilayer structure, the doping profile comprising at least a first doping peak and a second doping peak;
    wherein at least one of the plurality of quantum layers of the n-conductive multilayer structure is arranged between the first doping peak and the second doping peak;
    wherein the n-conducting multilayer structure comprises a region that is adjacent to the first doping peak, the quantum layers and the barrier layers adjacent to the quantum layers having a low doping concentration in said region, wherein the low doping concentration is at least $1*10^{16}$ cm$^{-3}$ and at most $1*10^{18}$ cm$^{-3}$; and
    wherein a sub-region of the quantum structure of the n-conductive multilayer structure comprises a high doping concentration by way of the second doping peak.

2. The semiconductor chip according to claim 1, wherein a doping concentration in at least one of the first doping peak and the second doping peak is at least five times as high as a doping concentration in a region of low n-conductive doping of the n-conductive multilayer structure.

3. The semiconductor chip according to claim 2, wherein the doping concentration in at least one of the first doping peak and the second doping peak is at least $4*10^{18}$ cm$^{-3}$ and wherein the doping concentration in the region of low n-conductive doping is at most $8*10^{17}$ cm$^{-3}$.

4. The semiconductor chip according to claim 1, wherein at least one of the first doping peak and the second doping peak exhibits a vertical extent of between 1nm and 30nm inclusive.

5. The semiconductor chip according to claim 4, wherein at least one of the first doping peak and the second doping peak exhibits a vertical extent of between 5 nm and 20 nm inclusive.

6. The semiconductor chip according to claim 1, wherein at least one of the first doping peak and the second doping peak exhibits a distance from the active region of between 2 nm and 20 nm inclusive.

7. The semiconductor chip according to claim 1, wherein the active region comprises a plurality of quantum layers, wherein the first doping peak is arranged between the quantum layer of the n-conductive multilayer structure closest to the active region and the quantum layer of the active region closest to the n-conductive multilayer structure.

8. The semiconductor chip according to claim 7, wherein a band gap of the quantum layer of the n-conductive multilayer structure is at least as large as a band gap of the quantum layer of the active region.

9. The semiconductor chip according to claim 1, wherein the semiconductor body has a recess that extends through the p-conductive semiconductor layer and the active region into the n-conductive multilayer structure, wherein the recess penetrates the quantum layers of the n-conductive multilayer structure.

10. The semiconductor chip according to claim 1, wherein the active region is based on a nitride compound semiconductor material.

11. The semiconductor chip according to claim 1, wherein a growth substrate for the semiconductor layer sequence is removed from the semiconductor body.

12. The semiconductor chip according to claim 1, wherein:
a doping concentration in at least one of the first doping peak and the second doping peak is at least five times as high as in a region of the n-conductive multilayer structure adjoining the respective one of the first doping peak and the second doping peak;
wherein the active region comprises a quantum structure with at least one quantum layer; and
wherein the n-conducting multilayer structure comprises a quantum structure with a plurality of quantum layers, wherein a band gap of at least one of the plurality of quantum layers of the n-conductive multilayer structure is larger than a band gap of at least one of the plurality of the quantum layer of the active region.

13. The semiconductor chip according to claim 1, wherein the region having the low doping concentration is arranged on a side of the first doping peak that is remote from the active region.

14. The semiconductor chip according to claim 1, wherein first doping peak is disposed between the second doping peak and the active region; and
wherein the second doping peak has a larger vertical extent than a vertical extent of the first doping peak.

15. The semiconductor chip according to claim 1, wherein the doping peak extends over at least two adjacent quantum layers of the plurality of quantum layers and over a barrier layer disposed between the at least two adjacent quantum layers.

* * * * *